(12) United States Patent
Lin et al.

(10) Patent No.: US 11,037,820 B2
(45) Date of Patent: Jun. 15, 2021

(54) METHOD FOR FORMING VIAS AND METHOD FOR FORMING CONTACTS IN VIAS

(71) Applicant: TAIWAN SEMICONDUCTOR MANUFACTURING CO., LTD., Hsinchu (TW)

(72) Inventors: Tzu-Yang Lin, Tainan (TW); Cheng-Han Wu, Taichung (TW); Ching-Yu Chang, Yilang County (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/719,596

(22) Filed: Dec. 18, 2019

(65) Prior Publication Data

US 2020/0126849 A1    Apr. 23, 2020

Related U.S. Application Data

(62) Division of application No. 16/007,648, filed on Jun. 13, 2018, now Pat. No. 10,515,847.

(Continued)

(51) Int. Cl.
*H01L 21/00* (2006.01)
*H01L 21/768* (2006.01)
(Continued)

(52) U.S. Cl.
CPC .... *H01L 21/76802* (2013.01); *H01L 21/0272* (2013.01); *H01L 21/0274* (2013.01); *H01L 21/0332* (2013.01); *H01L 21/76877* (2013.01)

(58) Field of Classification Search
CPC .......... H01L 21/76802; H01L 21/0272; H01L 21/0332
See application file for complete search history.

(56) References Cited

U.S. PATENT DOCUMENTS 5,667,940 A * 9/1997 Hsue ..................... G03F 7/0035
                                                        257/E21.024
6,221,562 B1 * 4/2001 Boyd ................... H01L 21/0274
                                                        257/E21.027

(Continued)

OTHER PUBLICATIONS

R. Brainard et al., "Review of Metallic Resists for EUV", EUV Symposium, SUNY Polytechnic Institute.

(Continued)

*Primary Examiner* — Laura M Menz
(74) *Attorney, Agent, or Firm* — McDermott Will & Emery LLP

(57) ABSTRACT

A method for forming openings in an underlayer includes: forming a photoresist layer on an underlayer formed on a substrate; exposing the photoresist layer; forming photoresist patterns by developing the exposed photoresist layer, the photoresist patterns covering regions of the underlayer in which the openings are to be formed; forming a liquid layer over the photoresist patterns; after forming the liquid layer, performing a baking process so as to convert the liquid layer to an organic layer in a solid form; performing an etching back process to remove a portion of the organic layer on a level above the photoresist patterns; removing the photoresist patterns, so as to expose portions of the underlayer by the remaining portion of the organic layer; forming the openings in the underlayer by using the remaining portion of the organic layer as an etching mask; and removing the remaining portion of the organic layer.

20 Claims, 12 Drawing Sheets

Related U.S. Application Data

(60) Provisional application No. 62/565,645, filed on Sep. 29, 2017.

(51) Int. Cl.
    *H01L 21/033*     (2006.01)
    *H01L 21/027*     (2006.01)

(56) References Cited

U.S. PATENT DOCUMENTS

| | | | |
|---|---|---|---|
| 7,935,477 B2 * | 5/2011 | Hsu | H01L 21/0338 430/313 |
| 8,450,052 B2 * | 5/2013 | Hsu | H01L 21/0271 430/323 |
| 8,551,651 B2 * | 10/2013 | Misumi | G03F 7/032 429/212 |
| 8,741,552 B2 * | 6/2014 | Chen | H01L 21/31144 430/323 |
| 8,927,147 B2 * | 1/2015 | Misumi | H01M 4/60 429/209 |
| 9,105,929 B2 * | 8/2015 | Misumi | H01M 4/1395 |
| 9,362,306 B2 * | 6/2016 | Park | H01L 27/1157 |
| 9,412,749 B1 * | 8/2016 | Shimabukuro | H01L 27/11519 |
| 9,543,318 B1 * | 1/2017 | Lu | H01L 27/11565 |
| 10,515,847 B2 * | 12/2019 | Lin | H01L 21/76816 |
| 2008/0064213 A1 * | 3/2008 | Jung | H01L 21/0273 438/696 |
| 2010/0119939 A1 * | 5/2010 | Misumi | H01M 4/48 429/212 |
| 2012/0034778 A1 * | 2/2012 | Hsu | H01L 21/0271 438/689 |
| 2013/0252098 A1 * | 9/2013 | Misumi | H01M 4/60 429/213 |
| 2013/0252099 A1 * | 9/2013 | Misumi | G03F 7/022 429/213 |
| 2017/0199464 A1 * | 7/2017 | Liu | H01L 21/0274 |
| 2017/0213722 A1 * | 7/2017 | Weng | G03F 7/30 |
| 2019/0103306 A1 * | 4/2019 | Lin | H01L 21/76816 |
| 2020/0126849 A1 * | 4/2020 | Lin | H01L 21/0274 |

OTHER PUBLICATIONS

S. Shigaki et al., "Dry Development Rinse (DDR) Process and Material for New Collapse Free Technique toward 1X nm and Beyond", International Symposium on Extreme Ultraviolet Lithography, Nissan Chemical Industries, LTD., EUVL Symposium, Washington, D.C., Oct. 27-29, 2014.

R. Sakamoto et al., Approach pattern collapse and etching issue by using Dry Development Risse Material (DDRM), 2011 International Symposium on Lithography Extensions, Nissan Chemical Industries, LTD.

Notice of Allowance issued in related U.S. Appl. No. 16/007,648, dated Sep. 6, 2019.

* cited by examiner

METHOD FOR FORMING VIAS AND METHOD FOR FORMING CONTACTS IN VIAS

CROSS-REFERENCE TO RELATED APPLICATION

This application is a divisional of U.S. patent application Ser. No. 16/007,648, filed Jun. 13, 2018, now U.S. Pat. No. 10,515,847, which claims priority to U.S. Provisional Application No. 62/565,645 filed Sep. 29, 2017, the entire disclosures of each of which are incorporated herein by reference.

BACKGROUND

In semiconductor, contacts can form in openings (or vias) in a dielectric layer to electrically connect contacts above and/or below the dielectric layer to implement internal connections among different layers such as metal layers in an integrated circuit. When critical dimension (CD) in the integrated circuit becomes smaller and smaller, the size of the contacts become smaller. Mask defect and flare effect can occur, when a positive tone developer is used to develop a positive tone photoresist, a pattern of which is used to make contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
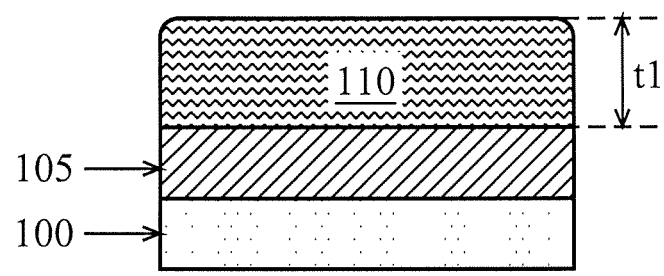
FIG. 1 shows a process step for manufacturing openings (or vias) in an underlayer by a method according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

FIGS. 1, 2A, and 3A to 6B show process steps for manufacturing openings (or holes or vias) in an underlayer by a method according to some embodiments of the present disclosure. FIG. 2B shows a schematic view of one type of mask used in the process step shown in FIG. 2A.

As shown in FIG. 1, a photoresist layer 110 is coated on a substrate 100 by a spin-coating process. The photoresist layer 110 is sensitive to a radiation beam during a lithography exposing process, and a patterned photoresist layer after developing the photoresist layer 110 is resistive to a subsequent process such as an etching of a layer below the photoresist layer 110. In some embodiment, the photoresist layer 110 can have a thickness t1 about 15 nm to about 30 nm. The present disclosure, however, is not limited thereto.

In some embodiments, the photoresist layer 110 is sensitive to the radiation beam generated by a mercury lamp having a wavelength of 436 nm (G-line) or 365 nm (I-line), a Krypton Fluoride (KrF) excimer laser with wavelength of 248 nm, an Argon Fluoride (ArF) excimer laser with a wavelength of 193 nm, a Fluoride ($F_2$) excimer laser with a wavelength of 157 nm, or other light sources having a desired wavelength (e.g., below approximately 100 nm). In another example, the photoresist layer 110 is sensitive to extreme ultraviolet (EUV) having a wavelength of about 13.5 nm or less.

In some embodiments, the photoresist layer 110 is a negative tone photoresist. The negative tone photoresist is a type of photoresist, in which portions of the photoresist that are exposed to a radiation beam during a lithography exposing process becomes insoluble to a photoresist developer used in a developing process and an unexposed portion of the photoresist that is not exposed to the radiation beam during the lithography exposing process becomes dissolved in the photoresist developer.

In some embodiments, the photoresist layer 110 includes a metallic material, a polymeric material as a matrix that is resistive, radiation-sensitive component (such as photo-acid generator (PAG)) that is reactive to the polymeric material, a quencher base, a chromophore, and/or a solvent.

In some embodiments, the metallic material of the photoresist layer 110 includes metal suboxide cations. In some embodiments, the metallic material of the photoresist layer 110 includes a hafnium oxide hydroxide sulfate (HafSO$_x$) that has both high radiation absorption coefficient elements (i.e., hafnium) and radiation sensitive ligands (i.e., peroxo species) sensitive to extreme ultraviolet (EUV) having a wavelength of about 13.5 nm.

In some embodiments, the metallic material of the photoresist layer 110 is silica. In certain embodiments, the metallic material is in a form of particles.

In some embodiments, the photoresist layer 110 can be a metallic photoresist. The metallic photoresist can be obtained from the manufacturer, Inpria, for example.

According to some embodiments, because the metallic material contained in the photoresist layer 110 has elements with higher/equivalent radiation absorption coefficient and ligands with higher/equivalent sensitivity to radiation, and has a smaller dissolvable particle size in a development solution after radiation exposure, a smaller critical dimension (CD) with a higher aspect ratio (an aspect ratio is a ratio of a thickness to a width of a pattern) can be achieved by using the photoresist layer 110, as compared to another photoresist layer that does not contain the above exemplary metallic material but uses organic materials instead to absorb radiation and to react with the absorbed radiation.

In some embodiments, after spin coating the photoresist layer 110, a thermal baking step can be performed to reduce the solvent of the photoresist layer 110.

The substrate 100 can be a semiconductor substrate formed of, for example, one of Si, Ge, SiGe, SiC, SP, SiPC, InP, InAs, GaAs, AlInAs, InGaP, InGaAs, GaAsSb, GaPN, AlPN, and any other suitable material, or an insulating substrate such as a glass substrate.

In some embodiments, although not shown, semiconductor devices such as transistors and/or contact/wiring layers are formed on the substrate 100. In this case, the photoresist layer 110 is coated on the semiconductor devices and/or the contact/wiring layers. The semiconductor devices and/or the contact/wiring layers include, but not limited to, a semiconductor material layer (such as a silicon layer, a germanium layer, or a silicon germanium layer) based on which channel regions, source and drain regions of the semiconductor devices are made, dielectric material (such as interlayer dielectrics), or conductive materials (such as a metal layer or a doped polysilicon layer) for forming gate electrodes and source and drain electrodes or conductive wirings.

In some embodiments, a first underlayer 105 can be formed prior to forming the photoresist layer 110. In some embodiments, the first underlayer 105 is substantially electrically conductive or semiconductive with electrical resistivity less than $10^3$ Ω·m at room temperature.

In other embodiment, the first underlayer 105 is a dielectric layer. In some embodiments, the first underlayer 105 has a dielectric constant from about 1.1 to about 40, or from about 1.1 to about 3.9, or from about 3.9 to about 40.

In some embodiments, the first underlayer 105 includes one or more of metal, metal alloy, metal nitride/sulfide/selenide/oxide/silicide with a formula $MX_a$, where M is a metal and X is N, S, Se, O, Si and a is about 0.4 to about 2.5, a combination thereof, or any other suitable material.

In some embodiments, the first underlayer 105 is made of one of Ti, Al, Co, W, Ni, Mo, Ru, TiN, WN$_2$, TaN, or a combination thereof.

In some embodiments, the first underlayer 105 includes one of Si, metal oxide, or metal nitride, or a combination thereof.

In some embodiments, the first underlayer 105 is made of a material having a formula $MX_b$, where M is a metal or Si, X is N or O, and b is about 0.4 to about 2.5.

In some embodiments, the first underlayer 105 is one of silicon oxide, silicon nitride, aluminum oxide, hafnium oxide, lanthanum oxide, or a combination thereof.

Although not shown, another underlayer can be formed below the first underlayer 105 and include a dielectric layer with openings and an electrically conductive material filling the openings of the dielectric layer to form contacts/wirings. The dielectric layer can be made of one or more of the above-described dielectric materials, and the electrically conductive material for forming the contacts/wirings can be made of one or more of the above-described electrically conductive materials, metals, or metal alloys. Thus, a description of the materials for forming the dielectric layer of the another underlayer and the electrically conductive material will be omitted to avoid redundancy.

As such, in a case in which the first underlayer 105 is a dielectric layer, contacts/wirings formed in openings (or holes/vias) of the first underlayer 105 can be electrically connected to contacts/wrings formed in the another underlayer (not shown) disposed below the first underlayer 105. Process steps to form openings (or holes/vias) in the first underlayer 105 and to form contacts/wirings in the openings (or holes/vias) of the first underlayer 105 will be described later with reference to FIGS. 7-10.

Figure 2A:
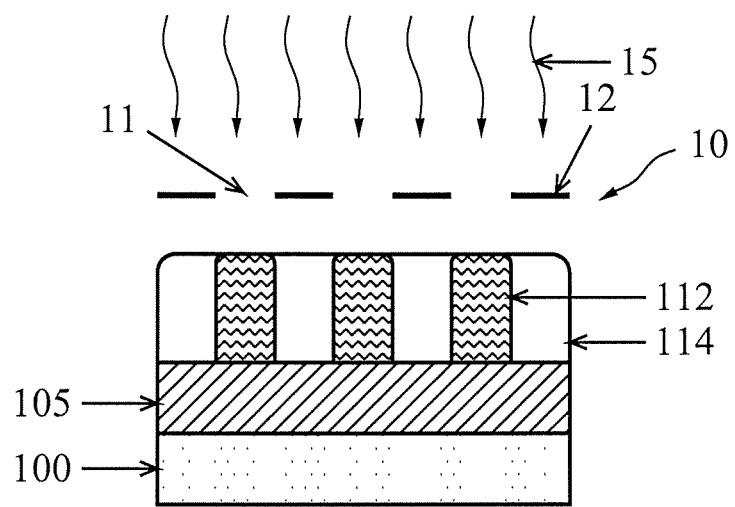
FIG. 2A shows a process step for manufacturing openings (or vias) in an underlayer by a method according to some embodiments of the present disclosure.
Figure 2B:
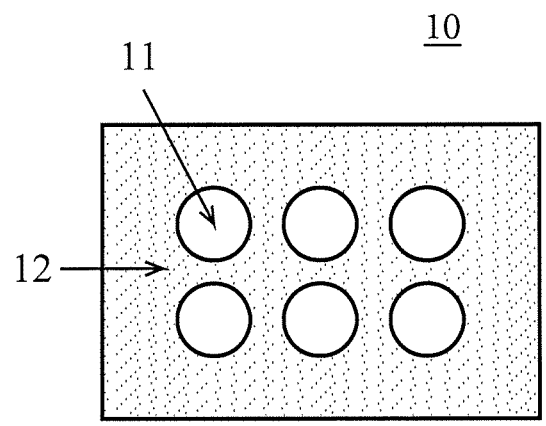
FIG. 2B shows a schematic view of one type of mask used in the process step shown in FIG. 2A.

Now referring to FIG. 2A, a lithography exposing process is performed to the photoresist layer 110 with a radiation beam 15. The radiation beam 15 can be generated by a mercury lamp having a wavelength of 436 nm (G-line) or 365 nm (I-line), a Krypton Fluoride (KrF) excimer laser with wavelength of 248 nm, an Argon Fluoride (ArF) excimer laser with a wavelength of 193 nm, a Fluoride ($F_2$) excimer laser with a wavelength of 157 nm, or other light sources having a desired wavelength (e.g., below approximately 100 nm). In other embodiments, the radiation beam has a wavelength of about 13.5 nm or less.

In some embodiments, as shown in FIGS. 2A and 2B, a mask used in the lithography exposing process is a binary mask 10 including a transparent substrate (e.g., fused quartz) (not shown) and an opaque material (e.g., chromium) coated in opaque regions 12 of the mask 10. Thus, regions 11 of the mask 10 not coated with the opaque material are transmissive to the radiation beam 15. One of ordinary skill in the art should appreciate that the binary mask 10 shown in FIG. 2B is merely an example for convenience of explanation; the present disclosure, however, is not limited thereto.

In other embodiments, although not shown, the mask used in the lithography exposing process is designed to have phase shift effects. In the phase shift mask (PSM), various features in the pattern formed on the mask are configured to have proper phase difference to enhance the resolution and imaging quality. In various examples, the PSM can be an attenuated PSM or an alternating PSM known in the art.

In some other embodiments, the mask is an extreme ultraviolet (EUV) mask having a reflective pattern. In one example, the EUV mask includes a substrate with a suitable material, such as a low thermal expansion material (LTEM). In various examples, the LTEM includes fused quartz, $TiO_2$ doped $SiO_2$, or other suitable materials with low thermal expansion. The EUV mask includes reflective multiple layers deposited on the substrate. The reflective multiple layers include a plurality of film pairs, such as molybdenum-silicon (Mo/Si) film pairs (e.g., a layer of molybdenum above or below a layer of silicon in each film pair). Alternatively, the reflective multiple layers can include molybdenum-beryllium (Mo/Be) film pairs, or other suitable materials that are configurable to highly reflect the EUV light. The EUV mask can further include a capping layer, such as ruthenium (Ru), disposed on the reflective multiple layers for protection. The EUV mask further includes an absorption layer, such as a tantalum boron nitride (TaBN) layer, deposited over the reflective multiple layers. The absorption layer is patterned to define a layer of an integrated circuit (IC) such as a layer of contacts/wirings or any other suitable structures. Alternatively, other reflective multiple layers can be deposited over the reflective multiple layers and are patterned to define a layer of an integrated circuit such as a layer of vias, thereby forming an EUV phase shift mask.

Referring to FIG. 2A, after the exposure, the photoresist layer 110 (shown in FIG. 1) is converted to regions 112 exposed to the radiation beam 15 and a remaining region 114 unexposed to the radiation beam 15.

Figure 3A:
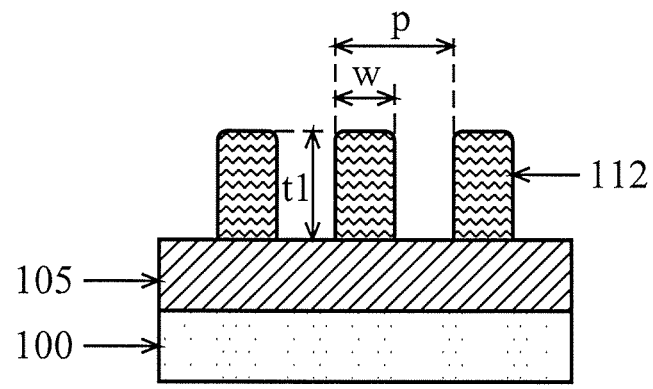
FIG. 3A shows a process step for manufacturing openings (or vias) in an underlayer by a method according to some embodiments of the present disclosure.
Figure 3B:
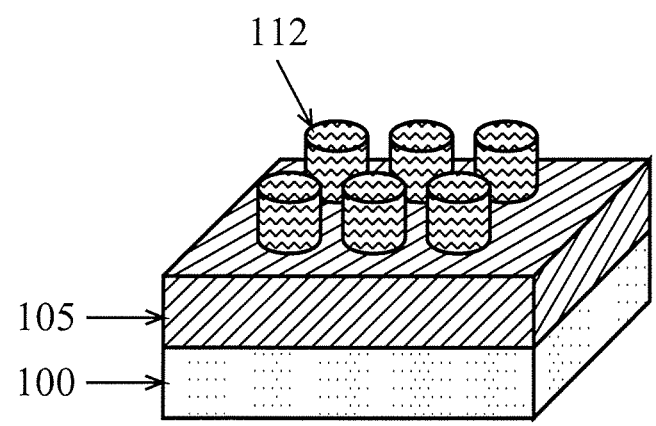
FIG. 3B shows a process step for manufacturing openings (or vias) in an underlayer by a method according to some embodiments of the present disclosure.

FIGS. 3A and 3B show a cross-sectional view and a three-dimensional view of the exposed photoresist layer 110 coated on the substrate 100 after being developed, respectively. In a case in which the photoresist layer 110 is a negative tone photoresist, portions of the photoresist layer 110 remaining on the substrate 100 after being developed are the regions 112 that have been exposed by the radiation beam 15 in the process step shown in FIG. 2A, and a portion of the photoresist layer 110 removed from the substrate 100 by the development process is the region 114 that has not been exposed by the radiation beam 15.

In some embodiments, after development, a rinse and spin drying is performed so as to remove and clean the development solution. Hereinafter, the regions 112 of the photoresist layer 110 that remain on the substrate 100 after the developing process are to be described as photoresist patterns 112.

According to some embodiments, a width w of the photoresist patterns 112 (or a diameter in a case in which the photoresist patterns 112 have cylinder shapes) is from about 15 nm to about 35 nm. The present disclosure, however, is not limited thereto.

According to some embodiments, a pitch p of the photoresist patterns 112 is from about 30 nm to about 70 nm. The present disclosure, however, is not limited thereto.

Although not shown, in some embodiments, after the lithography exposing process and before the developing process, the photoresist layer 110 can be baked to reduce, for example, standing wave phenomena caused by destructive and constructive interference patterns of the incident light from the radiation beam 15 during the lithography exposing process.

Next, a coating liquid is spin coated on the photoresist patterns 112. In some embodiments, the coating liquid fills space between the photoresist patterns 112 and completely covers the photoresist patterns 112. The coated liquid has a thickness t2 greater than the thickness t1 of the photoresist patterns 112. In some embodiments, the thickness t2 of the coating liquid is about 20% or 50% greater than the thickness t1 of the photoresist patterns 112 to ensure that the coating liquid can sufficiently cover the photoresist patterns 112 and to secure a planar exterior surface. The present disclosure, however, is not limited thereto.

In some embodiments, the coating liquid includes an organic material. In some embodiments, the coating liquid is a dry development rinse material (DDRM). In some embodiments, the DDRM includes a polymer having a structural unit of Formula (1) and a molecular average weight of 500 to 3500, a solvent, and water.

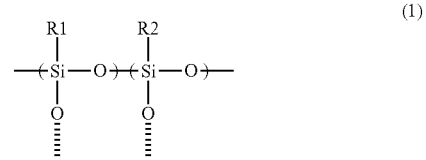

in which R1 and R2 are functional units such as a $C_{1-8}$ organic group. In some embodiments, the DDRM may be the DDRM manufactured by Nissan Chemical Industries, Ltd. In some embodiments, the coating liquid coated on the photoresist patterns 112 is baked to dry so that the coating liquid becomes a solid layer shown in FIG. 4. In some embodiments, the baking is performed at a temperature from 80° C. to 120° C. for 30 seconds to 90 seconds on a hot plate. Hereinafter, the solid layer 124 made of the coating liquid is to be described as an organic layer 124.

Figure 4:
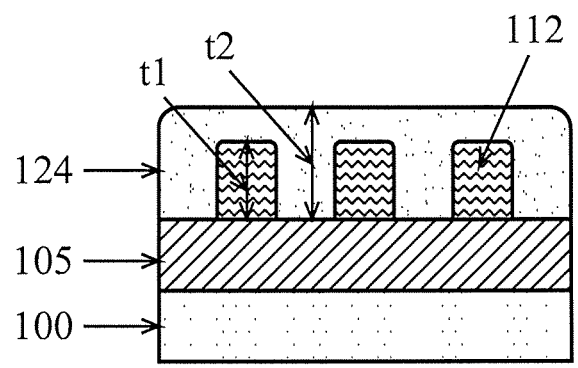
FIG. 4 shows a process step for manufacturing openings (or vias) in an underlayer by a method according to some embodiments of the present disclosure.

In other embodiments, the coating liquid coated on the photoresist patterns 112 is dried at a room temperature in a vacuum, or dried on a hot plate at a temperature from 80° C. to 120° C. in a vacuum, so that the coating liquid becomes a solid layer shown in FIG. 4.

In some embodiments, the photoresist patterns 112 and the organic layer 124 have different optical properties including an index of refraction, reflectivity, and/or transmittivity.

In some embodiments, one or more of molecular structures, acid labile molecules, PAG loading amounts, quencher loading amounts, chromophores, cross linkers, or solvents contained the photoresist patterns 112 or the photoresist layer 110 are different from those contained in the organic layer 124 or the coating liquid for forming the organic layer 124.

Next, an etching back process is performed to the organic layer 124 until the photoresist patterns 112 are exposed from the organic layer 124 by the etching back process. In some embodiments, the etching selectivities of the organic layer 124 and the photoresist patterns 112 are different from each. For example, by the same etching process used in the etching back process, an etching rate of the organic layer 124 is faster than an etching rate of the photoresist patterns 112. In some embodiments, the etching back process is a plasma etching process using a mixture of $CF_4$ and Ar at a ratio of about 40 to about 60 standard cubic centimeters per minute (sccm) to from about 180 to about 220 sccm at a pressure of about 5 to about 20 Pa, with a power of about 180 to about 220 W, although the present disclosure is not limited thereto.

Figure 5:
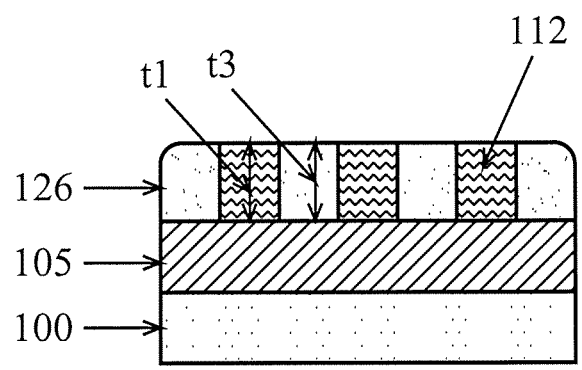
FIG. 5 shows a process step for manufacturing openings (or vias) in an underlayer by a method according to some embodiments of the present disclosure.

As shown in FIG. 5, after the etching back process, the thickness t2 of the organic layer 124 is reduced and the organic layer 124 is converted to a patterned organic layer 126 having a thickness t3 substantially the same as the thickness t1 of the photoresist patterns 112, according to some embodiments. In this case, the photoresist patterns 112 are exposed by the patterned organic layer 126. In other embodiment, the thickness t3 of the patterned organic layer 126 can be slightly less than, for example, about 0 nm to about 3 nm less than, the thickness t1 of the photoresist patterns 112, due to over-etching in the etching back process. In one embodiment, the thickness t3 of the patterned organic layer 126 is about 10% or less than the thickness t1 of the photoresist patterns 112 by the over-etching.

Thereafter, a photoresist removal process is performed so that the exposed photoresist patterns 112 are removed. In some embodiments, the etching selectivities of the patterned organic layer 126 and the photoresist patterns 112 are different from each other. For example, by the same etching process used in the photoresist removal process, an etching rate of the patterned organic layer 126 is slower than an etching rate of the photoresist patterns 112. In some embodiments, the etching back process is a plasma etching process using $O_2$ with a flow rate of about 5 to about 15 sccm at a pressure of about 0.1 to about 10 Pa, with a power of about 280 to about 320 W, although the present disclosure is not limited thereto. In some embodiments, other gases such as Ar or $N_2$ can be mixed with $O_2$.

Figure 6A:
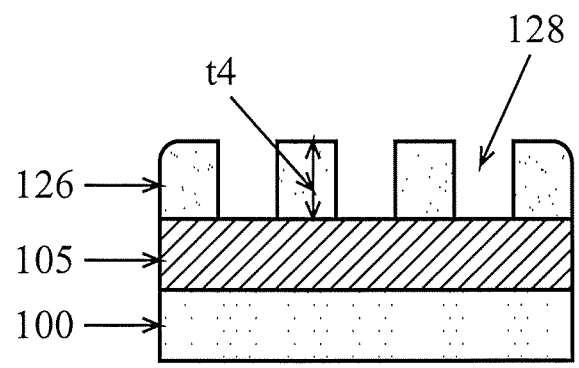
FIG. 6A shows a process step for manufacturing openings (or vias) in an underlayer by a method according to some embodiments of the present disclosure.
Figure 6B:
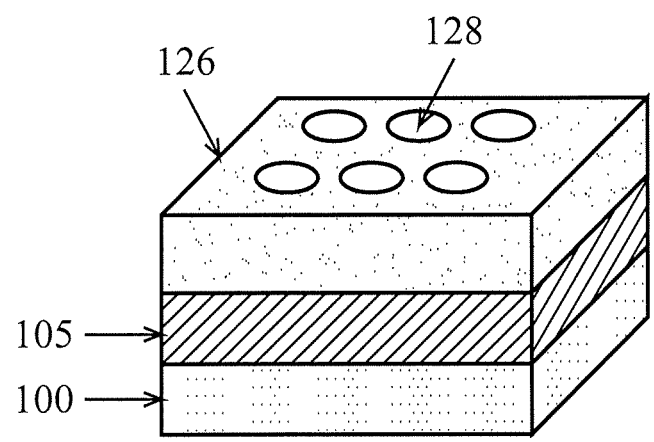
FIG. 6B shows a process step for manufacturing openings (or vias) in an underlayer by a method according to some embodiments of the present disclosure.

FIGS. 6A and 6B respectively show a cross-sectional view and a three-dimensional view of the patterned organic layer 126 remained on the substrate 100 after removing the photoresist patterns 112, according to some embodiments. As shown in the drawings, the patterned organic layer 126 includes openings (or vias) 128. One of ordinary skill in the art should understand that a portion of the patterned organic layer 126 can be consumed by the photoresist removal process, since the photoresist removal process can slightly remove the patterned organic layer 126 at an etching rate slower than that of the patterned organic layer 126. In this case, a thickness t4 of the patterned organic layer 126 after removing the photoresist patterns 112 can be the same or slightly less than, for example, about 0 nm to about 3 nm less than, the thickness t3 of the patterned organic layer 126 before removing the photoresist patterns 112. In one embodiment, the thickness t4 of the patterned organic layer 126 after removing the photoresist patterns 112 is about 10% or less than the thickness t3 of the patterned organic layer 126 before removing the photoresist patterns 112.

Referring to the drawings, the thickness t4 of the patterned organic layer 126 after removing the photoresist patterns 112 shown in FIG. 6A is primarily determined by, or substantially equal to, the thickness t1 of the photoresist layer 110 with some reduction, for example, about 0 nm to about 3 nm or about 0 nm to about 6 nm, due to the etching back process and the photoresist removing process.

As described above, a patterned layer having openings (or vias) are formed on a substrate through a series of processes shown in FIGS. 1, 2A, and 3A-6B.

One of ordinary skill in the art should understand that openings 128 (or vias) formed in the patterned organic layer 126 shown in FIGS. 6A and 6B is merely an example and the present disclosure should not be limited thereto. In other embodiments, other structures including, but not limited to, polygonal structures in a plan view, rectangular structures in a plan view, oval structures in a plan view, circular structures in a plan view, and/or a combination thereof, can be formed in the patterned organic layer 126.

According to some embodiments, the patterned organic layer 126 having openings 128 can be used as an etching mask to transfer the patterns of the openings 128 to the underlayer 105. These features will be more apparent with reference to FIGS. 7 and 8.

Figure 7:
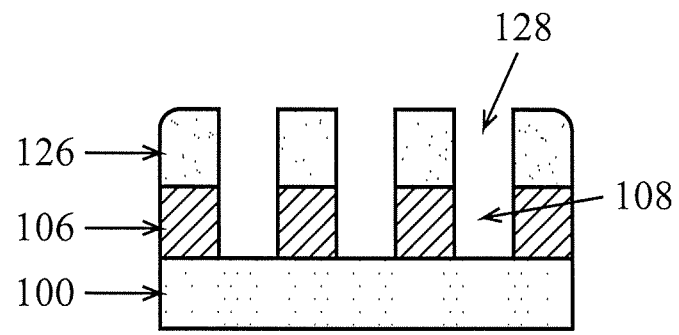
FIG. 7 shows a process step for manufacturing openings (or vias) in an underlayer by a method according to some embodiments of the present disclosure.

In some embodiments, an etching process such as a dry etching process or a wet etching process is performed to the first underlayer 105 with the patterned organic layer 126 as an etching mask, by using a property that etching selectivities of the patterned organic layer 126 and the first underlayer 105 by the same etching process are different. FIG. 7 shows that the patterned organic layer 126 having openings 128 is transferred to a patterned underlayer 106 made of the first underlayer 105 with openings 108 by a dry etching process, a wet etching process, or any other suitable etching process.

Figure 8:
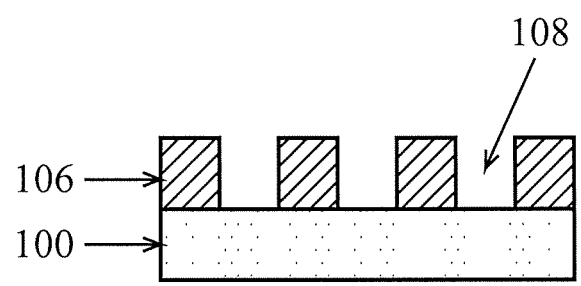
FIG. 8 shows a process step for manufacturing openings (or vias) in an underlayer by a method according to some embodiments of the present disclosure.

Thereafter, as shown in FIG. 8, the patterned organic layer 126 is removed, for example, by the same recipe used in the etching back process described with reference to FIGS. 4 and 5. The present disclosure is not limited thereto. For example, another suitable etching process can be used to remove the patterned organic layer 126, as long as an etching rate of the pattern organic layer 126 is faster than an etching rate of the patterned underlayer 106 by the another etching process.

In some embodiments, although not shown, elements of semiconductor devices such as transistors and/or contacts/wirings are formed on the substrate 100. In a case in which the first underlayer 105 or the patterned underlayer 106 is made of a dielectric layer and the openings 108 in the patterned underlayer 106 expose the semiconductor devices such as transistors and/or contacts/wirings formed on the substrate 100, the patterned underlayer 106 with openings 108 (or vias) can be used to form contacts/wirings in the patterned underlayer 106 to electrically connect the elements of semiconductor devices such as transistors and/or contacts/wirings below the patterned underlayer 106 to an upper layer (not shown) formed on the patterned underlayer 106 in subsequent processes.

Figure 9:
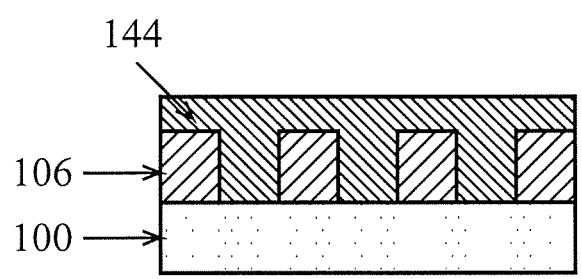
FIG. 9 shows a process step for manufacturing contacts in an underlayer by a method according to some embodiments of the present disclosure.
Figure 10:
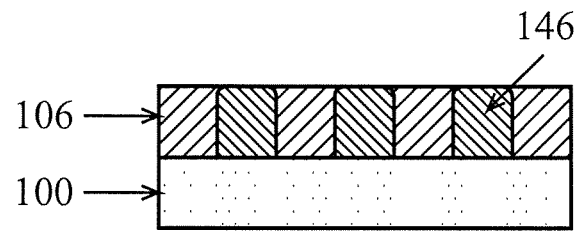
FIG. 10 shows a process step for manufacturing contacts in an underlayer by a method according to some embodiments of the present disclosure.

FIGS. 9 and 10 show process steps for forming conductive contacts in the openings (or vias) formed in the underlayer by the method according to some embodiments of the present disclosure.

Referring to FIG. 9, a metal layer 144 made of Cu, W, Al, AlCu, TiN, TiW, Ti, Co, Ni, TaN, Ta, or any other suitable metals, or combination thereof is formed to fill in the openings 108 in the patterned underlayer 106 and also to cover the upper surface of the patterned underlayer 106.

Referring to FIG. 10, a chemical-mechanical polishing (CMP) process is performed to the metal layer 144, such that the metal layer 144 on a level above the upper surface of the patterned underlayer 106 is removed and thus the remaining portions of the metal layer 144 become contacts 146 (or wirings).

As described above, in some embodiments, because the photoresist layer 110 is a negative tone photoresist and the metallic material contained thereof has a relatively smaller dissolvable particle size in a development solution, a dark tone process can be used to form the photoresist patterns 112 as shown in FIGS. 3A and 3B. As such, the photoresist patterns 112 can have improved CD and higher aspect ratio, as compared to an example made by a different manufacturing method.

As described above, in some embodiments, because the dry development rinse material (DDRM) having a liquid form is coated and is then converted to a solid form which has a different etching selectivity from the photoresist patterns 112, the photoresist patterns 112 can be transferred in the DDRM as openings 128 thereof, as shown in FIGS. 6A and 6B. As such, the patterned organic layer 126, made of the DDRM, can have an improved CD and a higher aspect ratio, for example, 3 or greater, as compared to an example made by a different manufacturing method.

As described above, in some embodiments, the openings 108 in the patterned underlayer 106, transferred from the openings 128 in the patterned organic layer 126, can also keep the improved CD and higher aspect ratio, as compared to an example made by a different manufacturing method.

Thus, the contacts 146 (or wirings) formed in the openings 108 of the patterned underlayer 106 can have improved CD and higher aspect ratio, as compared to an example made by a different manufacturing method. Accordingly, more contacts or wirings can be formed in a unit area with a higher yield, thereby improving integration capability when semiconductor devices are scaled down, for example, to 14 nm, 10 nm, 7 nm, 5 nm, or beyond, as compared to an example made by a different manufacturing method.

One of ordinary skill in the art should understand that forming contacts in the opening (or vias) formed in the patterned underlayer 106 described with reference to FIGS. 9 and 10 are merely an example, and the present disclosure should not limited thereto. In some embodiments, the patterned underlayer 106 can be used as an implantation mask to dope impurities into a material layer below the patterned underlayer 106. In some embodiments, the structure formed at the process step shown in FIG. 8 are semiconductor fin structures, and thus the process step shown in FIG. 9 can be modified to change the layer 144 as a dielectric layer to act as shallow trench isolation (STI). In some embodiments, the patterned underlayer 106 can be used an etching mask to transfer patterns thereof to a layer therebelow. One of ordinary skill in the art should understand that these modified embodiments are merely examples to show various application of the method for forming the structure shown in FIG. 8, and one of ordinary skill in the art should also understand how to modify the above described processes to manufacture other structures, in accordance with design particulars.

According to some embodiments, the above-described processes can be modified with reference to FIGS. 11 and 12 to be described below.

For example, after the process step shown in FIG. 2A, a development process is performed such that the unexposed portion 114 of the photoresist layer 110 (shown in FIG. 1) is dissolved by a development solution while the exposed portions 112 of the photoresist layer 110 maintains. In some embodiments, the development solution can be removed and cleaned by a rinse process. In other embodiments, the development solution can be substituted with the coating liquid by omitting the rinse process.

Figure 11:
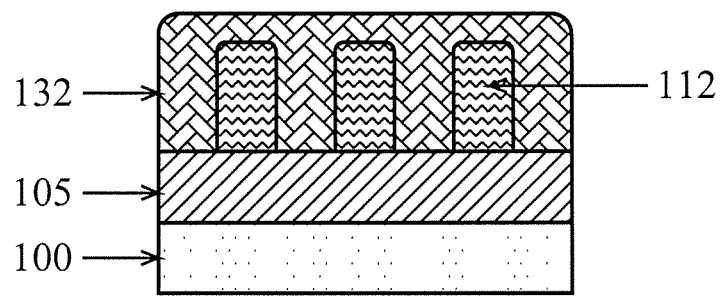
FIG. 11 shows a process step for manufacturing openings (or vias) in an underlayer by a method according to some embodiments of the present disclosure.

Then, without performing a drying process after the rinse process or after the development process if the rinse process is omitted (i.e., keeping the structure on the substrate 100 wet since the development process), the aforementioned coating liquid, denoted by reference numeral 132 in FIG. 11, is applied to the exposed photoresist layer 110 by a spin coating process, and as such, the exposed portions 112 or the photoresist patterns 112 are completely covered by the coating liquid 132.

Figure 12:
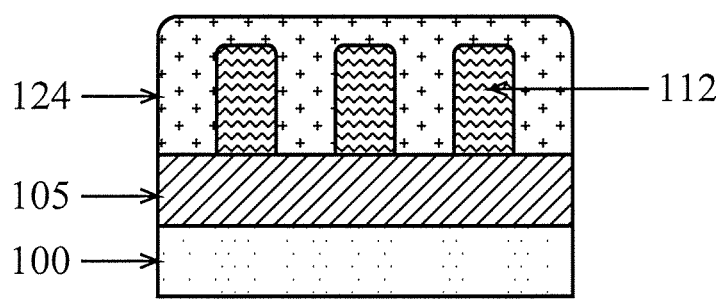
FIG. 12 shows a process step for manufacturing openings (or vias) in an underlayer by a method according to some embodiments of the present disclosure.

Then, the coating liquid 132 is baked to form an organic layer 124 in a solid state as shown in FIG. 12. In some embodiments, the baking is performed at a temperature from 80° C. to 120° C. for 30 seconds to 90 seconds on a hot plate.

Other process steps can be the same or substantially the same as those described with reference to FIGS. 1, 2A, and 5-10. To avoid redundancy, a description thereof will be omitted.

According to some embodiments, since the modified processes shown in FIGS. 11 and 12 include a spin coating process to apply the coating liquid 132 on the wet photoresist patterns 112 and a baking process to convert the coating liquid 132 to the organic layer 124 having a solid form, and do not use a drying process to dry the photoresist patterns 112, collapse between adjacent photoresist patterns 112, caused by a capillary force, can be avoided, even if a distance between adjacent photoresist patterns 112 is, for example, 15 nm, 10 nm, 7 nm, or less.

FIGS. 13-20B show process steps for manufacturing openings (or vias) in an underlayer by a method according to some embodiments of the present disclosure.

Figure 13:
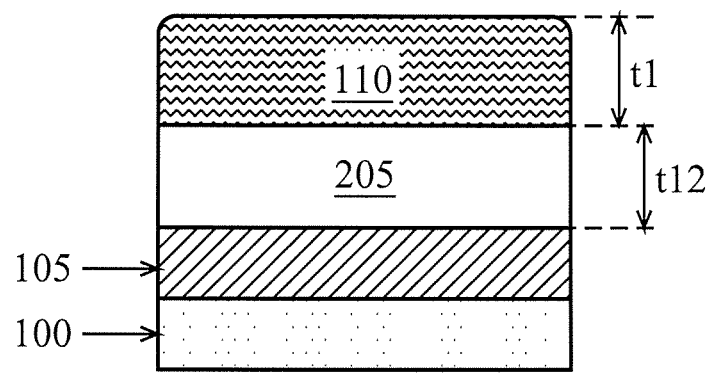
FIG. 13 shows a process step for manufacturing openings (or vias) in an underlayer by a method according to some embodiments of the present disclosure.

As shown in FIG. 13, a photoresist layer 110 is coated over a substrate 100 by a spin-coating process. In some embodiment, the photoresist layer 110 can have a thickness t1 about 15 nm to about 30 nm. The present disclosure, however, is not limited thereto. The photoresist layer 110 is sensitive to a radiation beam during a lithography exposing process and is resistive to a subsequent process (such as etching or ion implantation). In some embodiments, a first underlayer 105 is formed prior to forming the photoresist layer 110. In some embodiments, a second underlayer 205 is formed between the first underlayer 105 and the photoresist layer 110. The second underlayer 205 has a thickness t12 greater than the thickness t1 of the photoresist layer 110. For example, the thickness t12 of the second underlayer 205 is about 50 nm to about 90 nm. The present disclosure, however, is not limited thereto.

In some embodiments, although not shown, elements of semiconductor devices such as transistors and/or contact/wiring layers are formed on the substrate 100. In this case, the first underlayer 105 and the second underlayer 205 can be formed over the semiconductor devices and/or the contact/wiring layers. The semiconductor devices and/or the contacts/wirings include, but not limited to, a semiconductor material layer (such as a silicon layer, a germanium layer, or a silicon germanium layer) based on which channel regions, source and drain regions of the semiconductor devices are made, dielectric material (such as interlayer dielectrics), or conductive materials (such as metal layer or a doped polysilicon layer) for forming gate electrodes and source and drain electrodes.

Materials for forming the substrate 100, the first underlayer 105, and the photoresist layer 110 can be referred to the description described with reference to FIG. 1 and thus will not be reiterated to avoid redundancy.

In some embodiments, the second underlayer 205 can be made of one or more of the aforementioned materials which are suitable to form the first underlayer 105. The first underlayer 105 and the second underlayer 205, however, are made of two different materials in some embodiments. For example, in a case in which material A (here, A is one of the aforementioned materials suitable to form the first underlayer 105) is used to form the first underlayer 105, material B (here, material B is another of the aforementioned materials suitable to form the first underlayer 105, but is different from material A) will be used to form the second underlayer 205. As such, etching selectivities of the first underlayer 105 and the second underlayer 205 are different from each other when the same etching process is applied.

Figure 14:
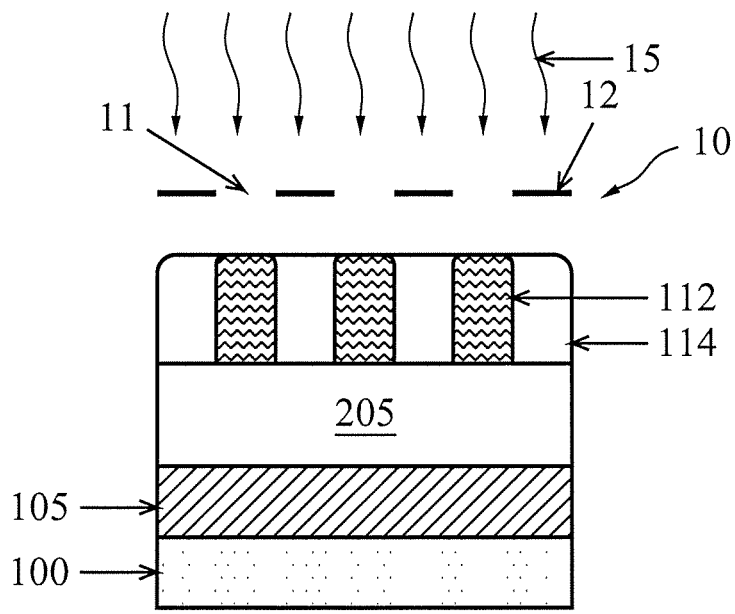
FIG. 14 shows a process step for manufacturing openings (or vias) in an underlayer by a method according to some embodiments of the present disclosure.

As shown in FIG. 14, a lithography exposing process is performed to the photoresist layer 110 with a radiation beam 15. In some embodiments, as shown in FIG. 14, a mask used in the lithography exposing process is a binary mask 10 including a transparent substrate (e.g., fused quartz) (not shown) and an opaque material (e.g., chromium) coated in opaque regions 12 of the mask 10. In other embodiments, although not shown, the mask used in the lithography exposing process is designed to have phase shift. A description of the radiation beam 15 and the mask can be referred to that described with the above-described embodiments, and thus will not be repeated here to avoid redundancy.

Referring to FIG. 14, after the exposure, the photoresist layer 105 is converted to regions 112 exposed to the radiation beam 15 and a remaining region 114 unexposed to the radiation beam 15, similar to the process step described with reference to FIG. 2A.

Figure 15A:
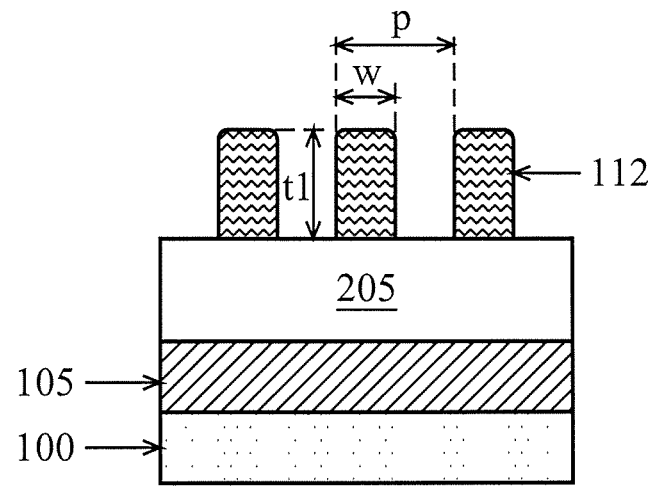
FIG. 15A shows a process step for manufacturing openings (or vias) in an underlayer by a method according to some embodiments of the present disclosure.
Figure 15B:
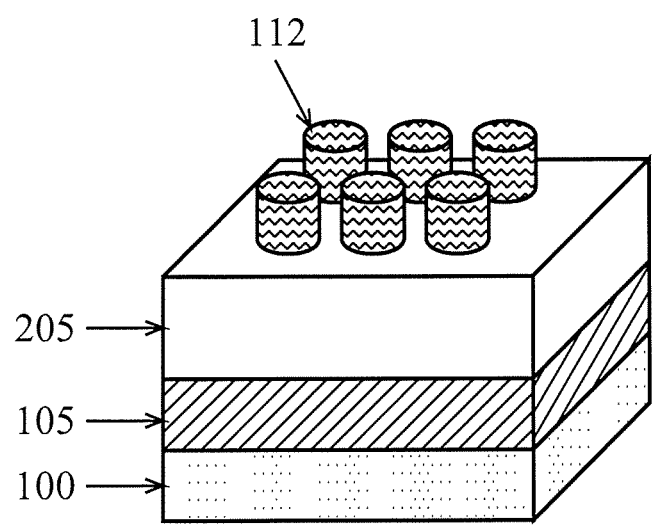
FIG. 15B shows a process step for manufacturing openings (or vias) in an underlayer by a method according to some embodiments of the present disclosure.

FIGS. 15A and 15B respectively show a cross-sectional view and a three-dimensional view of the exposed photoresist layer 112 coated on the substrate 100 after being developed. In a case in which the photoresist layer 110 is a negative tone photoresist, portions of the photoresist layer 110 remain on the substrate 100 after being developed are the regions 112 that have been exposed by the radiation beam 15 in the process step described with reference to FIG. 14A. In some embodiments, after development, a rinse and spin drying is performed so as to remove the development solution. Hereinafter, the regions 112 of the photoresist layer 110 that remain on the substrate 100 after the developing process are to be described as photoresist patterns 112.

In some embodiments, after the lithography exposing process and before the developing process, the photoresist layer 110 can be baked to reduce standing wave phenomena caused by destructive and constructive interference patterns of the incident light from the radiation beam 15 during the lithography exposing process.

Figure 16:
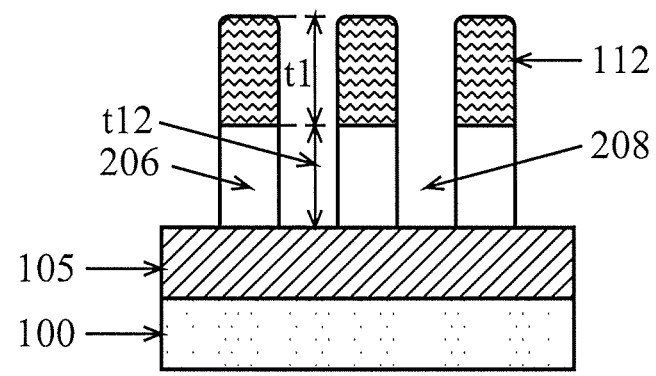
FIG. 16 shows a process step for manufacturing openings (or vias) in an underlayer by a method according to some embodiments of the present disclosure.

In some embodiments, an etching process such as a dry etching process or a wet etching process is performed to the second underlayer 205 with the photoresist patterns 112 as an etching mask, based on etching selectivities of the photoresist patterns 112 and the second underlayer 205. FIG. 16 shows that the photoresist patterns 112 are transferred to a patterned underlayer 206 made of the second underlayer 206 with openings 208.

Figure 17:
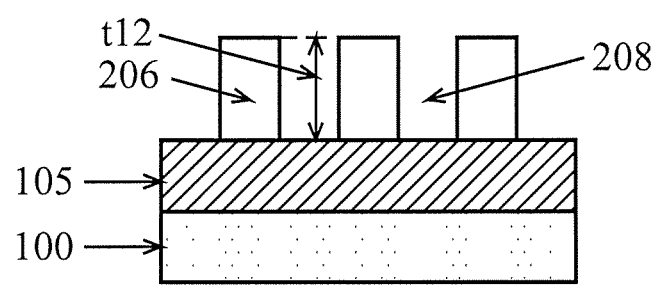
FIG. 17 shows a process step for manufacturing openings (or vias) in an underlayer by a method according to some embodiments of the present disclosure.

FIG. 17 shows a cross-sectional view of the patterned second underlayer 206 with the openings 208 remained on the substrate 100 after the photoresist patterns 112 are removed, according to some embodiments. In some embodiments, the etching selectivities of the patterned second underlayer 206 and the photoresist patterns 112 are different from each other. For example, by the same etching technique, an etching rate of the patterned second underlayer 206 is slower than an etching rate of the photoresist patterns 112. In some embodiments, the photoresist patterns 112 can be removed by a plasma etching process using $O_2$ with a flow rate of about 5 to about 15 sccm at a pressure of about 0.1 to about 10 Pa, with a power of about 280 to about 320 W, although the present disclosure is not limited thereto. In some embodiments, other gases such as Ar or $N_2$ can be mixed with $O_2$.

Figure 18:
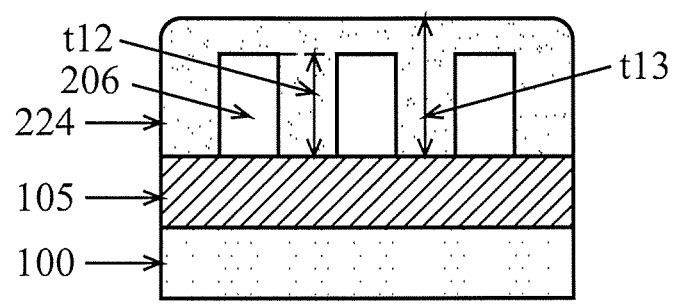
FIG. 18 shows a process step for manufacturing openings (or vias) in an underlayer by a method according to some embodiments of the present disclosure.

Next, a coating liquid, which fills the openings 208 of the patterned second underlayer 206, is coated on the patterned second underlayer 206. In some embodiments, the coated liquid has a thickness t13 greater than the thickness t12 of the patterned second underlayer 206. In some embodiments, the thickness t13 of the coating liquid is about 20% or 50% greater than the thickness t12 of the patterned second underlayer 206 to ensure that the coated liquid can sufficiently cover the patterned second underlayer 206 and to secure a planar exterior surface. In some embodiments, the coating liquid includes an organic material. In some embodiments, the coating liquid is a dry development rinse material (DDRM). In some embodiments, the DDRM includes a polymer having a structural unit of Formula (1) and a molecular average weight of 500 to 3500, a solvent, and water. In some embodiments, the DDRM may be the DDRM manufactured by Nissan Chemical Industries, Ltd. In some embodiments, the coating liquid coated on the patterned second underlayer 206 is baked to dry so that the coating liquid becomes a solid layer 224 as shown in FIG. 18. In some embodiments, the baking is performed at a temperature from 80° C. to 120° C. for 30 seconds to 90 seconds on a hot plate. Hereinafter, the solid layer 224 made of the coating liquid is to be described as an organic layer 224.

Next, an etching back process is performed to the organic layer 224 which stops when the patterned second underlayer 206 is exposed. In some embodiments, the etching selectivities of the organic layer 224 and the patterned second underlayer 206 are different from each. For example, by the same etching technique used in the etching back process, an etching rate of the organic layer 224 is faster than an etching rate of the patterned second underlayer 206. In some embodiments, the etching back process is a plasma etching process using a mixture of $CF_4$ and Ar at a ratio of about 40 to about 60 standard cubic centimeters per minute (sccm) to about 180 to about 220 sccm at a pressure of about 5 to about 20 Pa, with a power of about 180 to about 220 W, although the present disclosure is not limited thereto.

Figure 19:
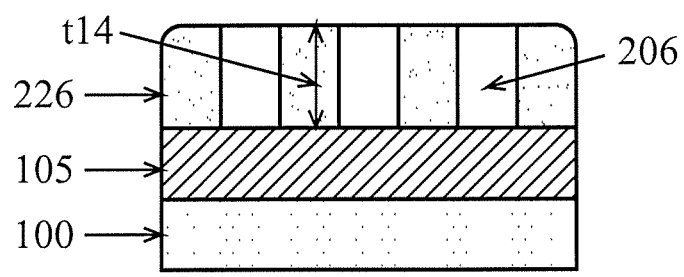
FIG. 19 shows a process step for manufacturing openings (or vias) in an underlayer by a method according to some embodiments of the present disclosure.

As shown in FIG. 19, after the etching back process, the height of the organic layer 224 is reduced and the organic layer 224 is converted to a patterned organic layer 226 which has a height substantially the same as that of the patterned second underlayer 206, according to some embodiments. In this case, the patterned organic layer 226 exposes the patterned second underlayer 206. In some embodiment, a thickness t14 of the patterned organic layer 226 can be substantially the same as the thickness t12 of the patterned second underlayer 206, or slightly less than, for example, about 0 nm to about 3 nm less than, the thickness t12 of the patterned second underlayer 206, due to over-etching in the etching back process. In one embodiment, the thickness t14 of the patterned organic layer 226 is about 10% or less than the thickness t12 of the patterned second underlayer 206, due to over-etching.

Figure 20A:
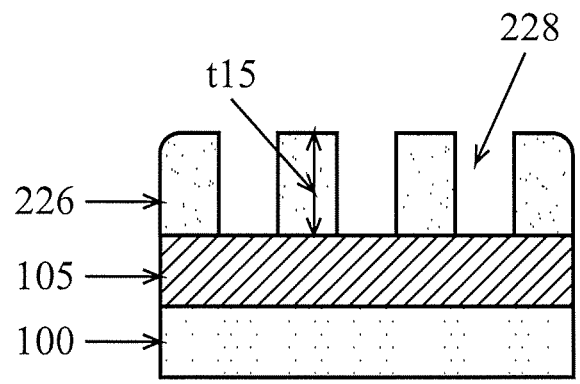
FIG. 20A shows a process step for manufacturing openings (or vias) in an underlayer by a method according to some embodiments of the present disclosure.
Figure 20B:
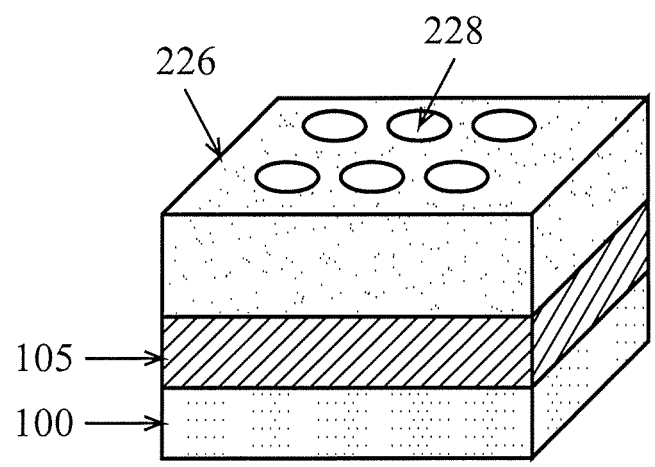
FIG. 20B shows a process step for manufacturing openings (or vias) in an underlayer by a method according to some embodiments of the present disclosure.

Thereafter, a patterned underlayer removal process is performed so that the exposed patterned second underlayer 206 is removed, as shown in FIGS. 20A and 20B which respectively show a cross-sectional view and a three-dimensional view of the patterned organic layer 226 on the substrate 100 after removal of the patterned second underlayer 206. In some embodiments, the etching selectivities of the patterned organic layer 226 and the patterned second underlayer 206 are different from each. For example, by the same etching technique, an etching rate of the patterned organic layer 226 is slower than an etching rate of the patterned second underlayer 206. Thus, portions of the first underlayer 105 are exposed by openings 228 of the patterned organic layer 226.

As described above, a patterned layer having openings (or vias) are formed on a substrate through a series of processes shown in FIGS. 13-20B.

Referring to the drawings, a thickness t15 of the patterned organic layer 226 after removing the patterned second underlayer 206 shown in FIG. 20A is primarily determined by, or substantially equal to, the thickness t12 of the second underlayer 205 with some reduction, for example, about 4 nm to about 12 nm, due to the etching back process and the patterned second underlayer 206 removing process.

Since the reduction in the thickness is primarily determined by the process and can be substantially the same as that occurred in the above-described embodiments with reference to FIGS. 1-6A, the thickness t15 of the patterned organic layer 226 after removing the patterned second underlayer 206 shown in FIG. 20A can be greater than the thickness of the patterned organic layer 126 after removing the photoresist patterns 112 shown in FIG. 6A, as long as the thickness t12 of the second underlayer 205 is greater than the photoresist layer 110.

One of ordinary skill in the art should understand that the thickness t1 of the photoresist layer 110 is controlled by a material property of the photoresist material, such as a viscosity, and a process condition such as spinning speed and spinning time in the coating process and thus cannot be greater than a certain range. On the other hand, the thickness t12 of the second underlayer 205 can be greater than the thickness t1, as long as enough time is given during a process to form the second underlayer 205. As such, the method according to the embodiments with reference to FIGS. 13 to 20B provides more design freedom with a much greater thickness range of the patterned organic layer than that formed by the method according to the embodiments with reference to FIGS. 1 to 6B. Accordingly, in a case in which other process condition or design parameters are substantially the same, the patterned organic layer 226 can have a higher aspect ratio than that of the patterned organic layer 126, or the openings 228 in the patterned organic layer 226 can have a higher aspect ratio than the openings 128 in the patterned organic layer 126.

One of ordinary skill in the art should understand that additional processes similar to the aforementioned process steps shown in FIGS. 7-10 can be performed to the structure shown in FIGS. 20A and 20B except for a thicker patterned organic layer, so as to form openings (or vias) in the first underlayer 105 and/or further form contacts in the openings (or vias) in the first underlayer 105. As such, an aspect ratio of the openings (or vias) and/or contacts formed in the first underlayer 105 can be further improved, because the openings 208 in the patterned organic layer 226 has a better aspect ratio than that of the openings 108 in the patterned organic layer 126. Other overlapped description will be omitted to avoid redundancy.

Although a negative tone photo resist is utilized in the foregoing embodiments, a positive tone photo resist can also be used to form an initial pattern that is a reverse pattern of the designed pattern.

According to some aspects, because a photoresist layer is a negative tone photoresist and a metallic material contained thereof has a relatively smaller dissolvable particle size in a development solution, a dark tone process can be used to form photoresist patterns. As such, the photoresist patterns can have improved CD and higher aspect ratio, as compared to an example made by a different manufacturing method.

According to some aspects, because a dry development rinse material (DDRM) having a liquid form is coated and is then converted to a solid form which has a different etching selectivity from the photoresist patterns, the photoresist patterns can be transferred in the DDRM as openings thereof. As such, the patterned organic layer, made of the DDRM, can have an improved CD and a higher aspect ratio, as compared to an example made by a different manufacturing method.

According to some aspects, because the DDRM can be spin-coated on the wet photoresist patterns and be converted from a liquid form to a solid form, without drying the photoresist patterns after a development process, collapse between adjacent photoresist patterns, caused by a capillary force, can be avoided.

According to some aspects, openings in a patterned underlayer, transferred from the openings in the patterned organic layer, can keep the improved CD and higher aspect ratio, as compared to an example made by a different manufacturing method.

According to some aspects, contacts 146 (or wirings) formed in the openings of the patterned underlayer can have improved CD and higher aspect ratio, as compared to an example made by a different manufacturing method. Accordingly, more contacts or wirings can be formed in a unit area with a higher yield, thereby improving integration capability when semiconductor devices are scaled down, as compared to an example made by a different manufacturing method.

In one embodiment, a method for forming openings in an underlayer includes forming a photoresist layer on an underlayer formed on a substrate; exposing the photoresist layer; forming photoresist patterns by developing the exposed photoresist layer with a development solution, the photoresist patterns covering regions of the underlayer in which the openings are to be formed; forming a liquid layer over the photoresist patterns; converting the liquid layer to an organic layer in a solid form; removing a portion of the organic layer on a level above the photoresist patterns; removing the photoresist patterns and leaving a remaining portion of the organic layer, so as to partially expose portions of the underlayer; forming the openings in the underlayer by using the remaining portion of the organic layer as an etching mask; and removing the remaining portion of the organic layer. In one embodiment, the photoresist layer is a negative photoresist layer made of a metallic photoresist material. In one embodiment, the metallic photoresist material comprises at least a metallic material, photo acid generator (PAG), quencher (base), chromophore, and a solvent. In one embodiment, the liquid layer is a dry development rinse material (DDRM). In one embodiment, the method further includes keeping the photoresist patterns wet since the development solution is applied until the liquid layer is formed. In one embodiment, the method further includes after applying the development solution and before applying the liquid layer, performing a rinse and drying process so as to completely remove the development solution. In one embodiment, EUV is applied to expose the photoresist layer. In one embodiment, the photoresist patterns have a pitch of 30 nm to 70 nm, a width of 15 nm to 35 nm, and a thickness of 15 nm to 30 nm.

In one embodiment, a method for forming openings in a first underlayer includes: forming openings in a second underlayer disposed on a first underlayer; applying a liquid layer to cover the second underlayer and fill the openings in the second underlayer; converting the liquid layer to an organic layer in a solid form; removing a portion of the organic layer on a level above the second underlayer; removing the second underlayer between a remaining portion of the organic layer and leaving the remaining portion of the organic layer, so as to partially expose portions of the first underlayer; forming the openings in the first underlayer by using the remaining portion of the organic layer as an etching mask; and removing the remaining portion of the organic layer. In one embodiment, the photoresist layer is a negative photoresist layer made of a metallic photoresist material. In one embodiment, the metallic photoresist material comprises at least a metallic material, PAG, quencher (base), chromophore, and a solvent. In one embodiment, EUV is applied to expose the photoresist layer. In one embodiment, a thickness of the second underlayer is greater than a thickness of the photoresist layer. In one embodiment, the method further includes: forming a photoresist layer on the second underlayer; exposing the photoresist layer; forming photoresist patterns by developing the exposed photoresist layer with a development solution, the photoresist patterns covering regions of the first underlayer in which the openings in the first underlayer are to be formed; and performing an etching to the second underlayer to form the openings in the second underlayer by using the photoresist patterns as an etching mask.

In one embodiment, a method for forming contacts in a dielectric layer includes forming a photoresist layer on the dielectric layer formed on a substrate; exposing the photoresist layer; forming photoresist patterns by developing the exposed photoresist layer with a development solution, the photoresist patterns covering regions of the dielectric layer in which the openings are to be formed; forming a liquid layer coated over the photoresist patterns; converting the liquid layer to an organic layer in a solid form; removing a portion of the organic layer on a level above the photoresist patterns; removing the photoresist patterns and leaving a remaining portion of the organic layer, so as to partially expose portions of the dielectric layer; forming openings in the dielectric layer by using the remaining portion of the organic layer as an etching mask; removing the remaining portion of the organic layer; and forming the contacts in the openings of the dielectric layer. In one embodiment, the photoresist layer is a negative photoresist layer made of a metallic photoresist material. In one embodiment, the metallic photoresist material comprises at least a metallic material, photo acid generator (PAG), quencher (base), chromophore, and a solvent. In one embodiment, the liquid layer is a dry development rinse material (DDRM). In one embodiment, EUV is applied to expose the photoresist layer. In one embodiment, the photoresist patterns have a pitch of 30 nm to 70 nm, a width of 15 nm to 35 nm, and a thickness of 15 nm to 30 nm.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming contacts in a dielectric layer, the method comprising:
    forming a photoresist layer on the dielectric layer formed on a substrate;
    exposing the photoresist layer;
    forming photoresist patterns by developing the exposed photoresist layer with a development solution, the photoresist patterns covering regions of the dielectric layer in which openings are to be formed;
    forming a liquid layer coated over the photoresist patterns;
    converting the liquid layer to an organic layer in a solid form;
    removing a portion of the organic layer on a level above the photoresist patterns;
    removing the photoresist patterns and leaving a remaining portion of the organic layer, so as to partially expose portions of the dielectric layer;
    forming openings in the dielectric layer by using the remaining portion of the organic layer as an etching mask;
    removing the remaining portion of the organic layer; and
    forming the contacts in the openings of the dielectric layer.

2. The method of claim 1, wherein the photoresist layer is a negative photoresist layer made of a metallic photoresist material.

3. The method of claim 2, wherein the metallic photoresist material comprises at least a metallic material, photo acid generator, quencher, chromophore, and a solvent.

4. The method of claim 1, wherein the liquid layer is a dry development rinse material.

5. The method of claim 1, wherein extreme ultraviolet radiation is applied to expose the photoresist layer.

6. The method of claim 1, wherein the photoresist patterns have a pitch of 30 nm to 70 nm, a width of 15 nm to 35 nm, and a thickness of 15 nm to 30 nm.

7. The method according to claim 4, wherein the dry development rinse material comprises a polymer having a structural unit of Formula (1):

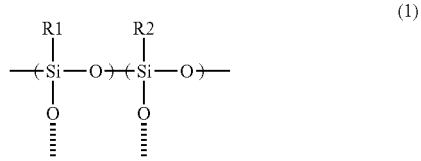

where R1 and R2 are C1-C8 organic groups.

8. The method according to claim 4, wherein the converting the liquid layer to a solid layer comprises baking the dry development rinse material at a temperature ranging from 80° C. to 120° C.

9. A method for forming contacts in a dielectric layer, the method comprising:
   forming a dielectric layer on a substrate;
   forming a photoresist layer on the dielectric layer;
   exposing the photoresist layer;
   forming a photoresist pattern by developing the exposed photoresist layer with a development solution, the photoresist pattern covering a region of the dielectric layer in which openings are to be formed;
   forming an organic liquid layer over the photoresist pattern;
   converting the organic liquid layer to a solid organic layer;
   removing a portion of solid organic layer on a level above the photoresist pattern;
   removing the photoresist pattern and leaving a remaining portion of the solid organic layer to partially expose a portion of the dielectric layer;
   forming openings in the dielectric layer by using the remaining portion of the solid organic layer as an etching mask;
   removing the remaining portion of the solid organic layer by etching the remaining portion of the solid organic layer; and
   forming the contacts in the openings of the dielectric layer.

10. The method of claim 9, wherein the photoresist layer is made of a negative photoresist material.

11. The method of claim 9, wherein the photoresist layer comprises a metallic photoresist material.

12. The method of claim 11, wherein the metallic photoresist material comprises at least a metallic material, photoacid generator, quencher, chromophore, and a solvent.

13. The method of claim 9, wherein photoresist layer is patterned using extreme ultraviolet radiation.

14. The method of claim 9, wherein the organic liquid layer comprises a polymer having a structural unit of Formula (1):

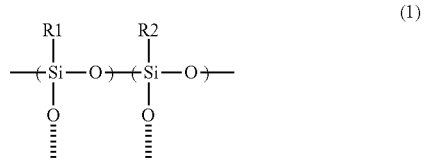

where R1 and R2 are C1-C8 organic groups.

15. The method of claim 9, wherein the photoresist pattern has a pitch of 30 nm to 70 nm, a width of 15 nm to 35 nm, and a thickness of 15 nm to 30 nm.

16. A method for forming contacts in a dielectric layer, the method comprising:
   forming a metallic photoresist layer on the dielectric layer formed on a substrate;
   exposing the metallic photoresist layer;
   forming a photoresist pattern by developing the exposed metallic photoresist layer with a development solution, the photoresist pattern covering a region of the dielectric layer in which openings are to be formed;
   forming an organic liquid layer comprising a polymer having a structural unit of Formula (1):

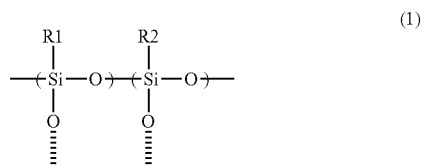

where R1 and R2 are C1-C8 organic groups, over the photoresist pattern;
   converting the organic liquid layer to an organic solid layer by baking the organic liquid layer at a temperature ranging from 80° C. to 120° C.;
   removing a portion of the organic solid layer by etching on a level above the photoresist pattern;
   removing the photoresist pattern and leaving a remaining portion of the organic solid layer to partially expose a portion of the dielectric layer;
   forming openings in the dielectric layer by using the remaining portion of the organic layer as an etching mask;
   removing the remaining portion of the organic layer; and
   forming metal contacts in the openings of the dielectric layer.

17. The method of claim 16, wherein the photoresist layer is a negative photoresist layer.

18. The method of claim 16, wherein the photoresist layer comprises a metallic photoresist material.

19. The method of claim 18, wherein the metallic photoresist material comprises at least a metallic material, photoacid generator, quencher, chromophore, and a solvent.

20. The method of claim 16, wherein photoresist layer is exposed to extreme ultraviolet radiation.

* * * * *